(12) United States Patent
Chen (10) Patent No.: US 10,600,932 B2
(45) Date of Patent: Mar. 24, 2020

(54) MANUFACTURING METHOD OF OPTOELECTRONIC SEMICONDUCTOR DEVICE

(71) Applicant: ULTRA DISPLAY TECHNOLOGY CORP., Taipei (TW)

(72) Inventor: Hsien-Te Chen, Taipei (TW)

(73) Assignee: ULTRA DISPLAY TECHNOLOGY CORP., Taipei (TW)

( * ) Notice: Subject to any disclaimer, the term of this patent is extended or adjusted under 35 U.S.C. 154(b) by 0 days.

(21) Appl. No.: 16/291,808

(22) Filed: Mar. 4, 2019

(65) Prior Publication Data

US 2019/0280151 A1 Sep. 12, 2019

(30) Foreign Application Priority Data

Mar. 7, 2018 (TW) .............................. 107107726 A (51) Int. Cl.
*H01L 33/00* (2010.01)
*H01L 27/15* (2006.01)
*H01L 33/52* (2010.01)

(52) U.S. Cl.
CPC ........ *H01L 33/0095* (2013.01); *H01L 27/153* (2013.01); *H01L 33/007* (2013.01); *H01L 33/52* (2013.01); *H01L 2933/005* (2013.01); *H01L 2933/0033* (2013.01)

(58) Field of Classification Search
None
See application file for complete search history.

(56) References Cited

U.S. PATENT DOCUMENTS

| 7,094,630 B2* | 8/2006 | Tomita .............. H01L 23/49822 257/738 |
| 2009/0115042 A1* | 5/2009 | Koyanagi ............. H01L 21/561 257/686 |
| 2013/0005085 A1* | 1/2013 | Shibuya ................ H01L 21/486 438/108 |
| 2016/0056055 A1* | 2/2016 | Ko ...................... H01L 23/3114 438/107 |

* cited by examiner

*Primary Examiner* — Angel Roman
(74) *Attorney, Agent, or Firm* — Muncy, Geissler, Olds & Lowe, P.C.

(57) ABSTRACT

A manufacturing method of an optoelectronic semiconductor device includes: providing a matrix substrate, which comprises a substrate and a matrix circuit disposed on the substrate; transferring a plurality of micro-sized optoelectronic semiconductor elements from a temporary substrate to the matrix substrate, wherein the micro-sized optoelectronic semiconductor elements are separately disposed on the matrix substrate, and at least one electrode of each micro-sized optoelectronic semiconductor element is electrically connected with the matrix circuit; forming a protective layer completely covering the micro-sized optoelectronic semiconductor elements, wherein the height of the protective layer is greater than the height of the micro-sized optoelectronic semiconductor elements; and grinding the protective layer until a residual on a back surface of each micro-sized optoelectronic semiconductor element and the back surface are removed to expose a new surface.

7 Claims, 5 Drawing Sheets

MANUFACTURING METHOD OF OPTOELECTRONIC SEMICONDUCTOR DEVICE

CROSS REFERENCE TO RELATED APPLICATIONS

This Non-provisional application claims priority under 35 U.S.C. § 119(a) on Patent Application No(s). 107107726 filed in Taiwan, Republic of China on Mar. 7, 2018, the entire contents of which are hereby incorporated by reference.

BACKGROUND

Technology Field

The present disclosure relates to a semiconductor device and, in particular, to an optoelectronic semiconductor device and a manufacturing method thereof.

Description of Related Art

A GaN-based light-emitting diode is epitaxial on, for example, a sapphire substrate. In the manufacturing process of an optoelectronic semiconductor device, in order to remove the sapphire substrate, the epitaxial wafer is permanently fixed to, for example, a silicon substrate by metal bonding, and then a laser lift-off (LLO) process for the sapphire substrate is performed. The LLO process is to dissociate the gallium nitride at the interface between the gallium nitride layer and the sapphire substrate into nitrogen ($N_2$) and gallium metal. After removing the sapphire substrate, the gallium metal remains on the surface of the gallium nitride layer. Traditionally, the gallium metal residuals on the surface of gallium nitride layer are cleaned with chemicals such as hydrochloric acid, so that the light emitted by the light-emitting diode can be prevented from being blocked by the gallium metal residuals. Afterwards, the processes of photolithography, plating, etching, and etc. are performed, followed by cutting the silicon substrate with a wheel cutter or a laser so as to obtain individual dies. The obtained dies can be packaged to form chips.

However, in the manufacture of an optoelectronic semiconductor device containing Micro light-emitting diodes (Micro LED), the Micro LED dies are usually temporarily fixed on a temporary substrate (for example but not limited to tape), and the LLO process for the sapphire substrate under the state of the temporary substrate. Next, a huge number of Micro LEDs are transferred from the temporary substrate to the target substrate and permanently fixed on the target substrate. It can be seen that the material of the temporary substrate needs a temporary fixing force to stably grasp the Micro LEDs on the temporary substrate, and the material of the temporary substrate also needs to withstand the subsequent LLO process. However, this temporary fixing force must be limited, otherwise it will obstruct the following huge amount transferring of the Micro LEDs. Moreover, if the process of using the chemical (such as hydrochloric acid) to clean the gallium metal residuals on the gallium nitride surface after the LLO process, the temporary substrate also needs to meet the chemical resistance requirement. These requirements increase the difficulty of selecting the material of the temporary substrate. In some cases, no material can meet all of the above requirements.

SUMMARY

In view of the foregoing, an objective of the present disclosure is to provide a manufacturing method of an optoelectronic semiconductor device, which does not utilize the conventional method of removing the residuals on the wafer back by acid and can obtain a higher illumination efficiency of the manufactured optoelectronic semiconductor device.

To achieve the above, the present disclosure provides a manufacturing method of an optoelectronic semiconductor device, comprising: providing a matrix substrate, wherein the matrix substrate comprises a substrate and a matrix circuit disposed on the substrate; transferring a plurality of micro-sized optoelectronic semiconductor elements from a temporary substrate to the matrix substrate, wherein the micro-sized optoelectronic semiconductor elements are separately disposed on the matrix substrate, and at least one electrode of each of the micro-sized optoelectronic semiconductor elements is electrically connected with the matrix circuit; forming a protective layer completely covering the micro-sized optoelectronic semiconductor elements, wherein a height of the protective layer is greater than a height of the micro-sized optoelectronic semiconductor elements; and grinding the protective layer until a residual on a back surface of each of the micro-sized optoelectronic semiconductor elements and the back surface are removed to expose a new surface.

In one embodiment, each of the micro-sized optoelectronic semiconductor elements comprises a p-type semiconductor layer, a light-emitting layer, an n-type semiconductor layer, a non-doped layer and a buffer layer, and the grinding step is to remove the buffer layer and a part of the non-doped layer.

In one embodiment, the grinding step is to remove the buffer layer and to reduce a thickness of the non-doped layer to less than 1.8 μm.

In one embodiment, the grinding step is to planarize the back surface of the micro-sized optoelectronic semiconductor element and make the new surface of the micro-sized optoelectronic semiconductor element be leveled with a surface of the adjacent protective layer away from the matrix substrate, and a height difference between the protective layer and the micro-sized optoelectronic semiconductor element is less than 0.02 μm.

In one embodiment, the manufacturing method further comprises: disposing a protective substrate on the micro-sized optoelectronic semiconductor elements, so that the micro-sized optoelectronic semiconductor elements and the protective layer are located between the protective substrate and the matrix substrate.

In one embodiment, a refractive index of the protective layer is equal to that of the protective substrate, or a difference between the refractive indexes of the protective layer and the protective substrate is less than 10% of the refractive index of the protective layer or the protective substrate.

In one embodiment, a refractive index of the protective layer is between that of the protective substrate and that of the micro-sized optoelectronic semiconductor element.

As mentioned above, the manufacturing method of an optoelectronic semiconductor device of this disclosure is to form a protective layer to cover the entire micro-sized optoelectronic semiconductor elements, and then to remove the residuals on the back surface of the micro-sized optoelectronic semiconductor element and a part of the micro-sized optoelectronic semiconductor element to expose a new surface of the micro-sized optoelectronic semiconductor element, which is away from the matrix substrate. Accordingly, the residuals remained on the back surface as well as the buffer layer and a part of the non-doped layer, which contain most defects in the micro-sized optoelectronic semiconductor element, can be removed. Compared with the conventional method of removing the residuals on the wafer back by acid in the conventional manufacturing method of the LED optoelectronic semiconductor device, the manufacturing method of an optoelectronic semiconductor device of this disclosure does not utilize the process of using a chemical to remove the residuals and can increase the illumination efficiency of the manufactured optoelectronic semiconductor device.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

The "optoelectronic semiconductor device" of this disclosure can be applied to display panels, advertising billboards, sensing devices, backlight modules or lighting devices. If the optoelectronic semiconductor device is a display device, it can be a monochrome or full color display device.

Figure 1:
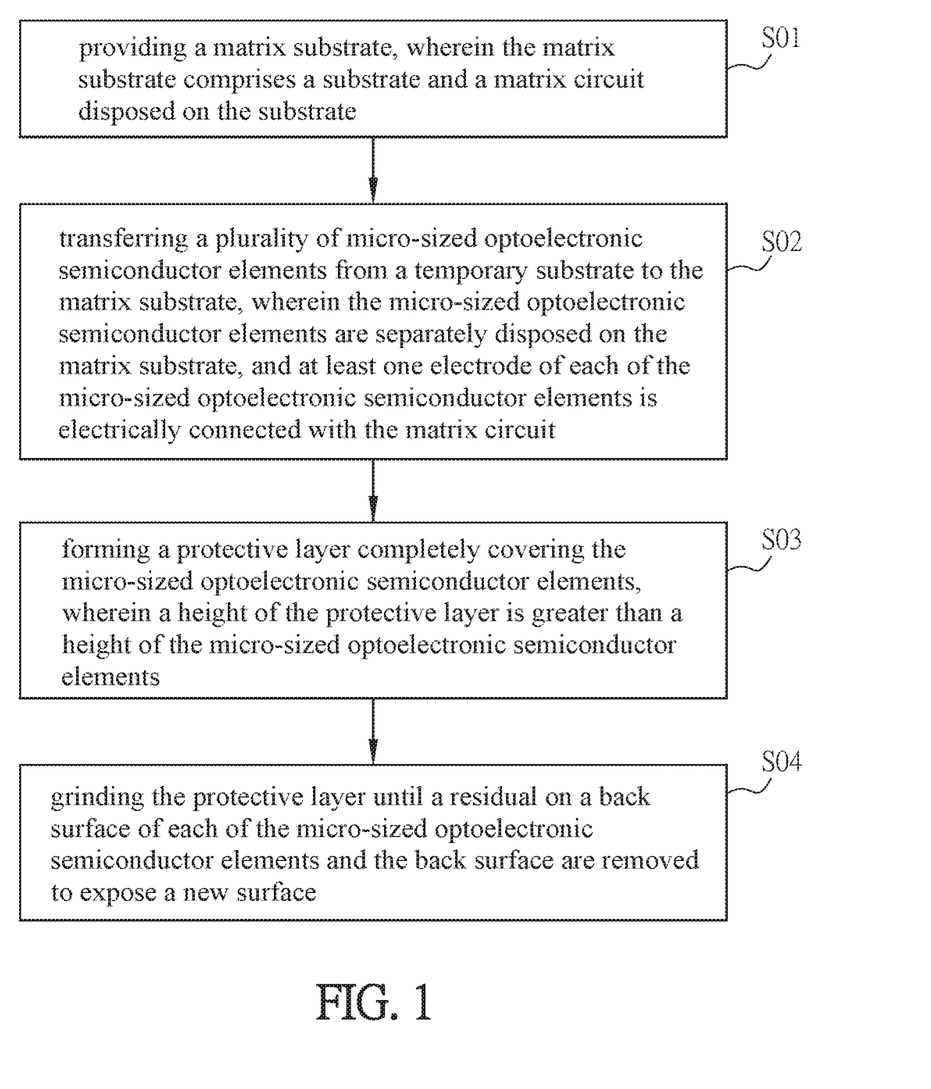
FIG. 1 is a flow chart of a manufacturing method of an optoelectronic semiconductor device according to an embodiment of this disclosure.

FIG. 1 is a flow chart of a manufacturing method of an optoelectronic semiconductor device according to an embodiment of this disclosure. As shown in FIG. 1, the manufacturing method of an optoelectronic semiconductor device comprises: providing a matrix substrate, wherein the matrix substrate comprises a substrate and a matrix circuit disposed on the substrate (step S01); transferring a plurality of micro-sized optoelectronic semiconductor elements from a temporary substrate to the matrix substrate, wherein the micro-sized optoelectronic semiconductor elements are separately disposed on the matrix substrate, and at least one electrode of each of the micro-sized optoelectronic semiconductor elements is electrically connected with the matrix circuit (step S02); forming a protective layer completely covering the micro-sized optoelectronic semiconductor elements, wherein a height of the protective layer is greater than a height of the micro-sized optoelectronic semiconductor elements (step S03); and grinding the protective layer until a residual on a back surface of each of the micro-sized optoelectronic semiconductor elements and the back surface are removed to expose a new surface (step S04).

FIGS. 2A to 2E are schematic diagrams showing a manufacturing procedure of an optoelectronic semiconductor device according to an embodiment of this disclosure. The above-mentioned steps S01 to S04 will be described hereinafter with reference to FIGS. 2A to 2E.

Figure 2A:
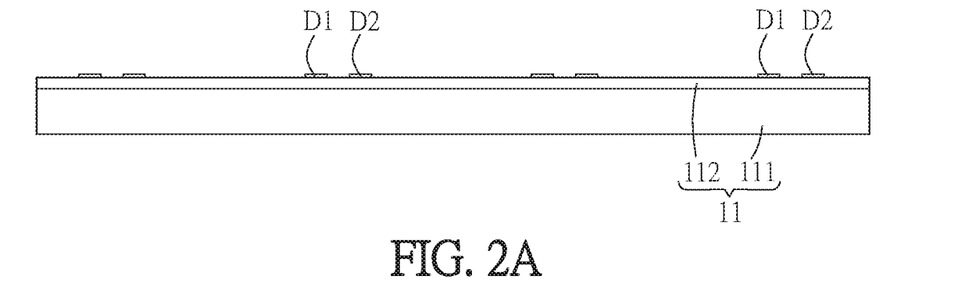
FIGS. 2A to 2E are schematic diagrams showing a manufacturing procedure of an optoelectronic semiconductor device according to an embodiment of this disclosure.

As shown in FIG. 2A, a matrix substrate 11 is provided firstly (step S01). The matrix substrate 11 comprises a substrate 111 and a matrix circuit 112 disposed on the substrate 111. The substrate 11 can be made of a transparent material, such as glass, quartz or the likes, plastics, rubber, glass fiber, or other polymer materials. In some embodiments, the substrate 11 can be made of opaque materials, such as a metal-glass fiber composition plate, or a metal-ceramics composition plate. In addition, the substrate 11 can be a rigid plate or a flexible plate. The flexible plate can be a flexible substrate such as a flexible circuit board. The flexible substrate can be made of polymer material, which can be a thermoplastic material such as, for example but not limited to, PI, polyethylene (PE), polyvinylchloride (PVC), PS, acrylic, fluoropolymer, polyester, or nylon, and this disclosure is not limited. In this embodiment, the matrix circuit 112 comprises a plurality of electrical connecting pads D1 and D2. One electrical connecting pad D1 and one electrical connecting pad D2 can be defined as one group, and they are separately disposed. In addition, according to the type of the matrix circuit 112 formed on the substrate 111, the matrix substrate 11 can be an active matrix (AM) substrate or a passive matrix (PM) substrate. For example, if the matrix substrate 11 is an AM matrix substrate (TFT substrate) of an LCD device, the matrix substrate 11 can be configured with a plurality of active elements (e.g. TFT) and a plurality of interlaced data lines and scan lines. Since the matrix circuit 112 and the driving technology of the AM matrix substrate can be easily understood by the skilled person in the art and is not the key point of this disclosure, so the detailed description thereof will be omitted.

Figure 2B:
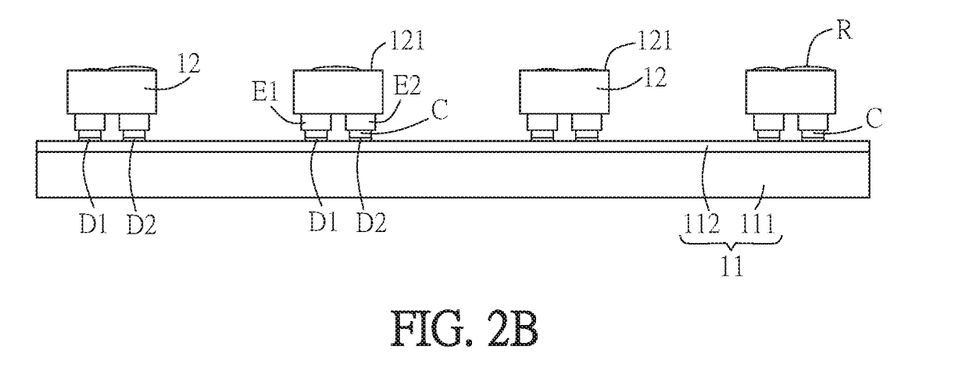

Next, as shown in FIG. 2B, the step SO2 is to transfer a plurality of micro-sized optoelectronic semiconductor elements 12 from a temporary substrate to the matrix substrate 11, wherein the micro-sized optoelectronic semiconductor elements 12 are separately disposed on the matrix substrate 11, and at least one electrode El of each of the micro-sized optoelectronic semiconductor elements 12 is electrically connected with the matrix circuit 112. In this embodiment, each micro-sized optoelectronic semiconductor element 12 comprises two electrodes E1 and E2, and the micro-sized optoelectronic semiconductor elements 12 are separately disposed on the matrix substrate 11, so that the electrodes E1 and E2 of the micro-sized optoelectronic semiconductor elements 12 can be disposed corresponding to the electrical connecting pads D1 and D2 of the matrix circuit 112. Accordingly, the electrodes E1 and E2 can be electrically connected with the electrical connecting pads D1 and D2, respectively, through a conductive material C.

Based on the requirement, the micro-sized optoelectronic semiconductor elements 12 can be arranged in a column, a row, a matrix (columns and rows), a polygonal shape or an irregular shape, and this disclosure is not limited thereto. In addition, the length of each micro-sized optoelectronic semiconductor element 12 is less than or equal to 150 μm (e.g. between 1 μm and 150 μm, 1 μm≤length≤150 μm). In some embodiments, the size of the micro-sized optoelectronic semiconductor element 12 can be, for example, 25 μm×25 μm, and the minimum pitch between two adjacent micro-sized optoelectronic semiconductor elements 12 can be 1 μm or smaller. This disclosure is not limited.

The micro-sized optoelectronic semiconductor elements 12 can be two-electrode elements (for example but not limited to LEDs) or three-electrode elements (e.g. transistors). In this embodiment, the micro-sized optoelectronic semiconductor elements 12 are Micro LEDs (pLED). The two electrodes (including a p-pole and an n-pole) of the micro-sized optoelectronic semiconductor element 12 may be disposed on the same side (horizontal structure), or disposed on the upper and lower sides respectively (vertical structure). In this embodiment, the micro-sized optoelectronic semiconductor element 12 is a pLED with a horizontally structure, and the two electrodes E1 and E2 thereof are disposed corresponding to a pair of electrical connecting pads D1 and D2. In addition, if classified by color rendering wavelength, the micro-sized optoelectronic semiconductor element 12 (μLED) may be a blue light LED, a red light LED, a green light LED, an IR LED, or a UV light LED, or a combination thereof.

In some embodiments, the temporary substrate used in the step S02 can be, for example but not limited to, a UV tape. In addition, before the transferring step S02, the micro-sized optoelectronic semiconductor elements 12 are formed on a substrate (e.g. a sapphire substrate), and this substrate is reversed to press the micro-sized optoelectronic semiconductor elements 12 on the temporary substrate. Accordingly, the electrodes E1 and E2 of the micro-sized optoelectronic semiconductor elements 12 can contact with and attached to the temporary substrate. Afterwards, the substrate is removed by, for example, LLO process, so that the micro-sized optoelectronic semiconductor elements 12 can be attached to the temporary substrate. Then, the micro-sized optoelectronic semiconductor elements 12 can be transferred from the temporary substrate to the matrix substrate 11 in the transferring step. The electrodes E1 and E2 of each micro-sized optoelectronic semiconductor element 12 can be electrically connected with the matrix circuit 112.

However, after the LLO process for removing the substrate, some residuals R are remained on the back of the micro-sized optoelectronic semiconductor elements 12 (the back surface 121, which is the surface of the micro-sized optoelectronic semiconductor element 12 away from the matrix substrate 11). The residuals R can be, for example but not limited to, gallium metal, which can block the light emitted from the micro-sized optoelectronic semiconductor elements 12 so as to decrease the illumination efficiency. However, the residuals R cannot be removed by the traditional chemical process (e.g. acid) due to the material of the temporary substrate. Moreover, if the material of the electrodes E1 and E2, the electrical connecting pads D1 and D2, or the conductive material C is not resisted to the chemical (e.g. acid), the traditional chemical process still cannot be used after transferring the micro-sized optoelectronic semiconductor elements 12 to the matrix substrate 11.

Figure 2C:
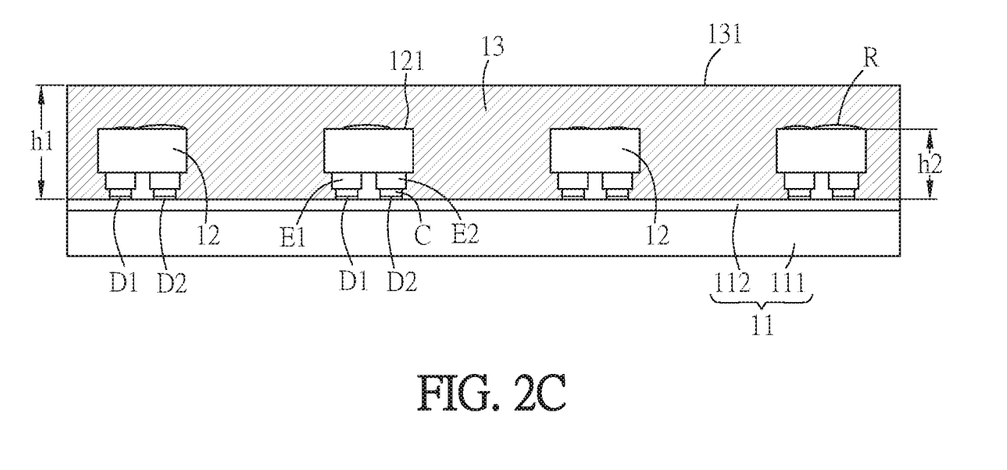

This disclosure does not use the transitional chemical process for removing the residuals R on the wafer back. In the step S03, as shown in FIG. 2C, a protective layer 13 is formed to cover all of the micro-sized optoelectronic semiconductor elements 12. The height h1 of the protective layer 13 is greater than the height h2 of the micro-sized optoelectronic semiconductor elements 12. In this embodiment, the height h1 of the protective layer 13 is equal to the distance between the matrix substrate 11 and the top surface 131 of the protective layer 13, and the height h2 of the micro-sized optoelectronic semiconductor elements 12 is equal to the distance between the matrix substrate 11 and the back surface 121 of the micro-sized optoelectronic semiconductor elements 12. Accordingly, the protective layer 13 can completely cover the back surface 121 of the micro-sized optoelectronic semiconductor elements 12 and the residuals R on the back surface 121. In some embodiments, the protective layer 13 is an insulation layer, which can be made of, for example but not limited to, epoxy, $SiO_x$, $SiO_xN_y$, or their combination, or any of other organic or inorganic insulation materials.

Figure 2D:
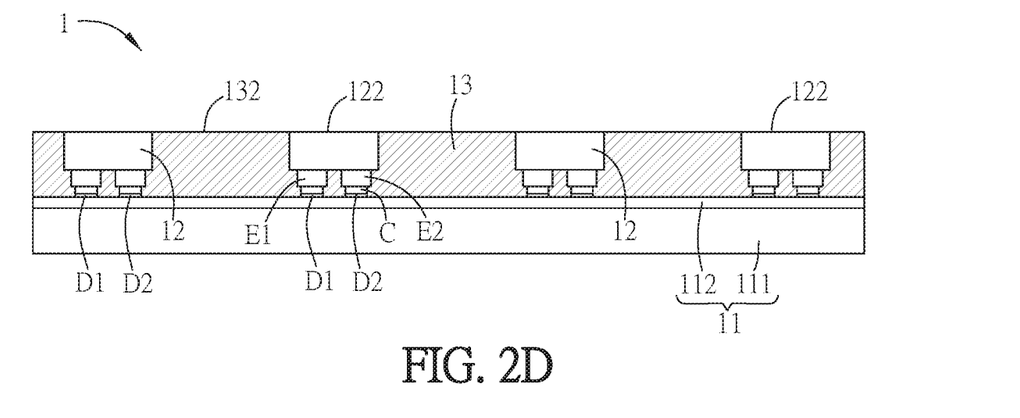

Finally, as shown in FIG. 2D, the protective layer 13 is grinded (step S04). After grinding the protective layer 13 to level with the micro-sized optoelectronic semiconductor elements 12, the grinding step is still continued until the residuals R on the back surface 121 of each of the micro-sized optoelectronic semiconductor elements 12 and the back surface 121 are removed to expose a new surface 122. The new surface 122 is the surface of the micro-sized optoelectronic semiconductor element 12 away from the matrix substrate 11 after the grinding step. In this embodiment, a grinding machine is provided to grind the object from the top surface 131 of the protective layer 13 to the matrix substrate 11. When the grinding machine reaches the back surface 121 of the micro-sized optoelectronic semiconductor element 12, the grinding process is still continued. This step can not only remove the residuals R on the back surface 121 but also planarize the back surface 121. The grinding process continues to remove a part of each micro-sized optoelectronic semiconductor element 12 until a new surface 122 of each micro-sized optoelectronic semiconductor element 12 away from the matrix substrate 11 is exposed. Accordingly, the new surface 122 of the micro-sized optoelectronic semiconductor element 12 and the surface 132 of the adjacent protective layer 13 away from the matrix substrate 11 can be located at the same level. In some embodiments, after the grinding process, the height difference between the protective layer 13 and the micro-sized optoelectronic semiconductor elements 12 can be less than, for example, 0.02 μm. In addition, after transferring the micro-sized optoelectronic semiconductor elements 12 to the matrix substrate 11, the back surfaces 121 of these micro-sized optoelectronic semiconductor elements 12 may be not located at the same level or not in parallel with each other. In this case, the grinding process can form a planar surface on the optoelectronic semiconductor device 1. Moreover, the protective layer 13 can not only provide the protection function but also firmly connect the micro-sized optoelectronic semiconductor elements 12 to the matrix substrate 11, thereby preventing the detachment of the micro-sized optoelectronic semiconductor elements 12 from the matrix substrate 11.

Figure 2E:
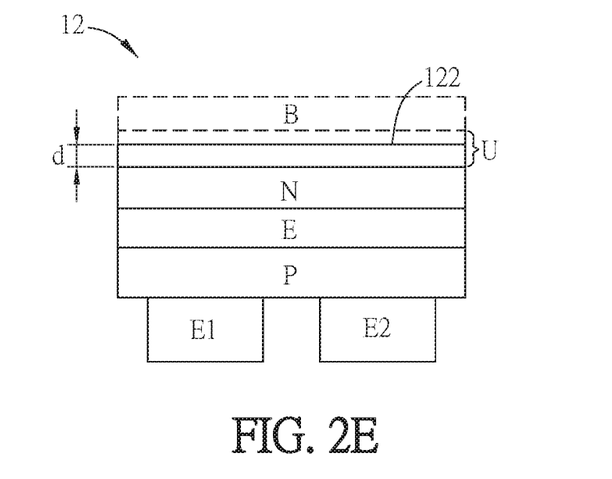

FIG. 2E is a schematic diagram showing a micro-sized optoelectronic semiconductor element according to an embodiment of this disclosure. As shown in FIG. 2E, if the micro-sized optoelectronic semiconductor element 12 is, for example, a micro LED, it comprises a p-type semiconductor layer P, a light-emitting layer E, an n-type semiconductor layer N, a non-doped layer U, and a buffer layer B. The grinding process (step S04) can remove the buffer layer B and a part of the non-doped layer U. In some embodiments, the grinding process can decrease the thickness d of the non-doped layer U to less than 1.8 μm. Specifically, in the manufacturing process of the Micro LED, the buffer layer B, which contains most defects, and the non-doped layer U are formed firstly, and then the N-type semiconductor layer N, the light-emitting layer E and the p-type semiconductor layer P are formed. To be noted, the micro-sized optoelectronic semiconductor element 12 of FIG. 2E is reversed.

Accordingly, after the above LLO process and transferring process, the buffer layer B, which contains most defects, and the non-doped layer U are disposed at the top, and the light emitted from the light-emitting layer E must pass through the buffer layer B, which contains most defects, and the non-doped layer U. Thus, the light will be absorbed by the defects so as to decrease the illumination efficiency. In this embodiment, the step S04 can remove the buffer layer B, which contains most defects, and the non-doped layer U by the grinding process, thereby increasing the illumination efficiency of the Micro LED.

As mentioned above, in the optoelectronic semiconductor device 1 of this embodiment, the protective layer 13 is formed to cover all of the micro-sized optoelectronic semiconductor elements 12, and then the grinding process is performed to remove the residuals R on the back surface 121 of each of the micro-sized optoelectronic semiconductor elements 12 and a part of the micro-sized optoelectronic semiconductor elements 12, thereby exposing a new surface 122 of each micro-sized optoelectronic semiconductor element 12 away from the matrix substrate 11. This step can remove the residuals R on the back surface 121 as well as the buffer layer B, which contains most defects, and the non-doped layer U of each micro-sized optoelectronic semiconductor element 12. Compared with the conventional manufacturing process of the LED optoelectronic semiconductor device that utilizes chemical to remove the residuals on the wafer back, the manufacturing process of the optoelectronic semiconductor device of this embodiment doses not utilize the chemical cleaning process and can increase the illumination efficiency. Moreover, since the size of the micro-sized optoelectronic semiconductor elements 12 is very small, the arrangement density thereof can be very high, so that the manufactured optoelectronic semiconductor device 1 can have a higher resolution. Thus, this disclosure is, particularly, suitable for manufacturing the high-resolution display device, such as the VR or AR head mounted display device.

Figure 2F:
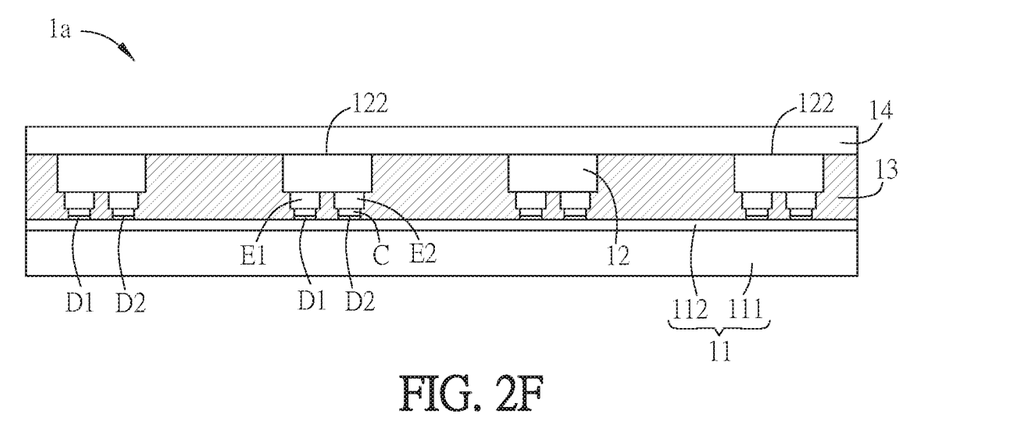
FIG. 2F is a schematic diagram showing an optoelectronic semiconductor device according to another aspect of this disclosure.

FIG. 2F is a schematic diagram showing an optoelectronic semiconductor device 1a according to another aspect of this disclosure. Different from the optoelectronic semiconductor device 1 of FIG. 2E, the manufacturing method of the optoelectronic semiconductor device 1a of FIG. 2F further comprises: disposing a protective substrate 14 on the micro-sized optoelectronic semiconductor elements 12, so that the micro-sized optoelectronic semiconductor elements 12 and the protective layer 13 are located between the protective substrate 14 and the matrix substrate 11. In this embodiment, the protective substrate 14 is disposed on the micro-sized optoelectronic semiconductor elements 12 by adhesion for protecting the micro-sized optoelectronic semiconductor elements 12. In some embodiments, the protective substrate 14 can be, for example, a transparent glass or a protective film. In some embodiments, the refractive index of the protective layer 13 is equal to that of the protective substrate 14, the refractive index of the protective layer 13 is approximate to that of the protective substrate 14 (e.g. a difference between the refractive indexes of the protective layer 13 and the protective substrate 14 is less than 10% of the refractive index of the protective layer 13 or the protective substrate 14). Alternatively, the refractive index of the protective layer 13 is between that of the protective substrate 14 and that of the micro-sized optoelectronic semiconductor element 12. This configuration can reduce the reflection of the light at the interface between the micro-sized optoelectronic semiconductor element 12 and the protective layer 13 or between the protective layer 13 and the protective substrate 14, so that the light can be easily outputted through the protective substrate 14.

FIGS. 3A to 3D are schematic diagrams showing a manufacturing procedure of an optoelectronic semiconductor device 1b according to another embodiment of this disclosure.

Figure 3A:
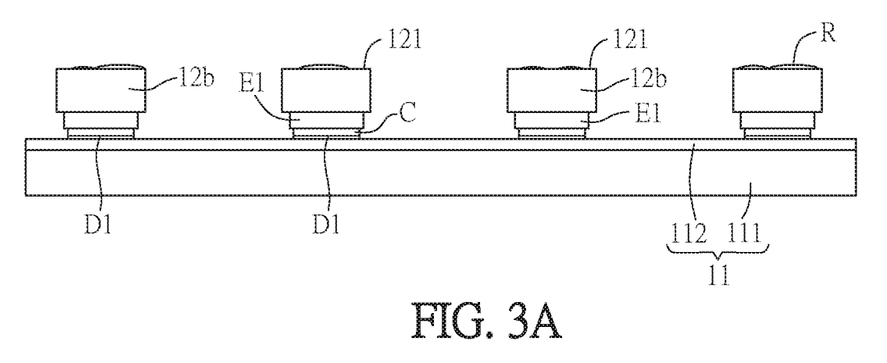
FIGS. 3A to 3D are schematic diagrams showing a manufacturing procedure of an optoelectronic semiconductor device according to another embodiment of this disclosure.
Figure 3B:
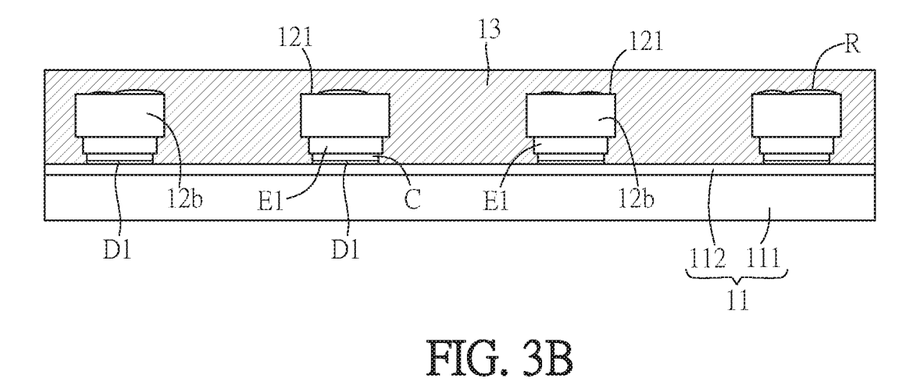
Figure 3C:
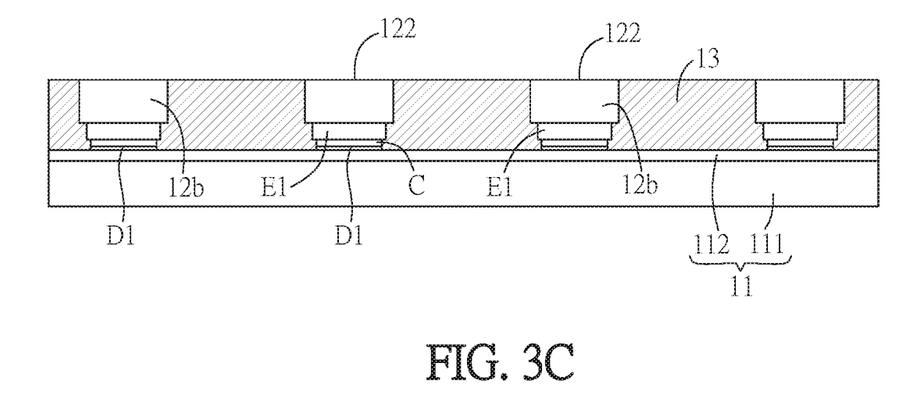
Figure 3D:
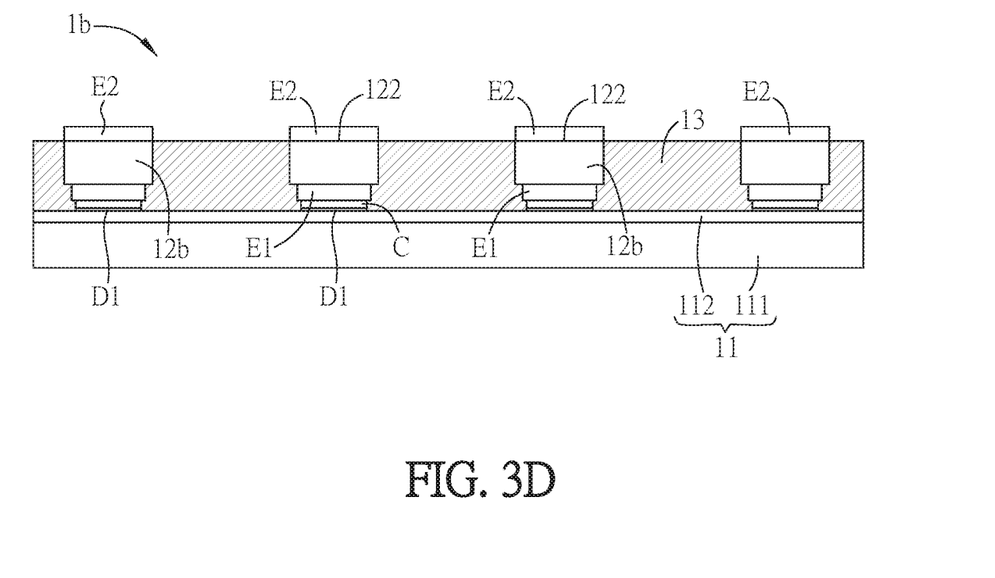

The manufacturing procedure of the optoelectronic semiconductor device 1b of FIGS. 3A to 3C can be mostly referred to that of the optoelectronic semiconductor device 1 of FIGS. 2B to 2D. Different from the optoelectronic semiconductor device 1, the micro-sized optoelectronic semiconductor elements 12b of this embodiment are vertical structure μLEDs. Accordingly, only one electrode E1 of each micro-sized optoelectronic semiconductor element 12b is electrically connected with the matrix circuit 112 through the conductive material C, and the other electrode E2 is a conductive layer formed on the new surface 122 of the micro-sized optoelectronic semiconductor element 12b (see FIG. 3D).

The other technical features of the optoelectronic semiconductor device 1b and the manufacturing method thereof can be referred to those of the optoelectronic semiconductor device 1 of the previous embodiment, so the detailed descriptions thereof will be omitted.

In summary, the manufacturing method of an optoelectronic semiconductor device of this disclosure is to form a protective layer to cover the entire micro-sized optoelectronic semiconductor elements, and then to remove the residuals on the back surface of the micro-sized optoelectronic semiconductor element and a part of the micro-sized optoelectronic semiconductor element to expose a new surface of the micro-sized optoelectronic semiconductor element, which is away from the matrix substrate. Accordingly, the residuals remained on the back surface as well as the buffer layer and a part of the non-doped layer, which contain most defects in the micro-sized optoelectronic semiconductor element, can be removed. Compared with the conventional method of removing the residuals on the wafer back by acid in the conventional manufacturing method of the LED optoelectronic semiconductor device, the manufacturing method of an optoelectronic semiconductor device of this disclosure does not utilize the process of using a chemical to remove the residuals and can increase the illumination efficiency of the manufactured optoelectronic semiconductor device.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A manufacturing method of an optoelectronic semiconductor device, comprising:
   providing a matrix substrate, wherein the matrix substrate comprises a substrate and a matrix circuit disposed on the substrate;
   transferring a plurality of micro-sized optoelectronic semiconductor elements from a temporary substrate to the matrix substrate, wherein the micro-sized optoelectronic semiconductor elements are separately disposed on the matrix substrate, and at least one electrode of each of the micro-sized optoelectronic semiconductor elements is electrically connected with the matrix circuit;

forming a protective layer completely covering the micro-sized optoelectronic semiconductor elements, wherein a height of the protective layer is greater than a height of the micro-sized optoelectronic semiconductor elements; and grinding the protective layer until a residual on a back surface of each of the micro-sized optoelectronic semiconductor elements and the back surface are removed to expose a new surface.

2. The manufacturing method according to claim 1, wherein each of the micro-sized optoelectronic semiconductor elements comprises a p-type semiconductor layer, a light-emitting layer, an n-type semiconductor layer, a non-doped layer and a buffer layer, and the grinding step is to remove the buffer layer and a part of the non-doped layer.

3. The manufacturing method according to claim 2, wherein the grinding step is to remove the buffer layer and to reduce a thickness of the non-doped layer to less than 1.8 μm.

4. The manufacturing method according to claim 1, wherein the grinding step is to planarize the back surface of the micro-sized optoelectronic semiconductor element and make the new surface of the micro-sized optoelectronic semiconductor element be leveled with a surface of the adjacent protective layer away from the matrix substrate, and a height difference between the protective layer and the micro-sized optoelectronic semiconductor element is less than 0.02 μm.

5. The manufacturing method according to claim 1, further comprising:

disposing a protective substrate on the micro-sized optoelectronic semiconductor elements, so that the micro-sized optoelectronic semiconductor elements and the protective layer are located between the protective substrate and the matrix substrate.

6. The manufacturing method according to claim 5, wherein a refractive index of the protective layer is equal to that of the protective substrate, or a difference between the refractive indexes of the protective layer and the protective substrate is less than 10% of the refractive index of the protective layer or the protective substrate.

7. The manufacturing method according to claim 5, wherein a refractive index of the protective layer is between that of the protective substrate and that of the micro-sized optoelectronic semiconductor element.

* * * * *